United States Patent [19]

Beighe et al.

[11] Patent Number: 5,175,835
[45] Date of Patent: Dec. 29, 1992

[54] MULTI-MODE DRAM CONTROLLER

[75] Inventors: Edward W. Beighe, Willow Grove; Anthony P. Lannutti, Norristown, both of Pa.

[73] Assignee: Unisys Corporation, Blue Bell, Pa.

[21] Appl. No.: 463,067

[22] Filed: Jan. 10, 1990

[51] Int. Cl.⁵ .................. G06F 12/02; G06F 12/00; G06F 12/10
[52] U.S. Cl. .................. 395/425; 364/DIG. 1; 364/245.31; 364/400; 365/230.03; 365/230.01
[58] Field of Search .......... 364/245.31, 245, 245.1; 365/230.01, 230.03, 230.04, 191; 395/425, 400

[56] References Cited

U.S. PATENT DOCUMENTS

| | | | |
|---|---|---|---|
| 4,303,993 | 12/1981 | Panepinto, Jr. et al. | 365/230.03 |
| 4,346,441 | 8/1982 | Plank et al. | 364/200 |
| 4,403,283 | 9/1983 | Myntti et al. | 364/200 |
| 4,545,010 | 10/1985 | Salas et al. | 364/200 |
| 4,675,808 | 6/1987 | Grinn | 364/200 |
| 4,731,738 | 3/1988 | Fisher et al. | 395/425 |
| 4,779,191 | 10/1988 | Greenblatt | 364/200 |
| 4,805,092 | 2/1989 | Cerutti | 364/200 |
| 4,849,875 | 7/1989 | Fairman et al. | 395/400 |
| 4,926,314 | 5/1990 | Dhuey | 364/200 |
| 5,005,157 | 4/1991 | Catlin | 365/193 |
| 5,023,777 | 6/1991 | Sawamoto | 364/200 |
| 5,047,989 | 9/1991 | Canepa et al. | 364/200 |
| 5,101,339 | 3/1992 | Fairman | 395/400 |

*Primary Examiner*—Alyssa H. Bowler
*Attorney, Agent, or Firm*—John B. Sowell; Mark T. Starr

[57] ABSTRACT

The present invention provides a novel multi-mode DRAM controller adaptd to access DRAM chips of a main storage unit of different size and of different mode types. The novel DRAM controller comprises new address generation and control logic for delaying the RAS and CAS control signals to memory and for expanding the number of address bits employed to address memory chips having a greater number of addresses by at least one address bit.

7 Claims, 3 Drawing Sheets

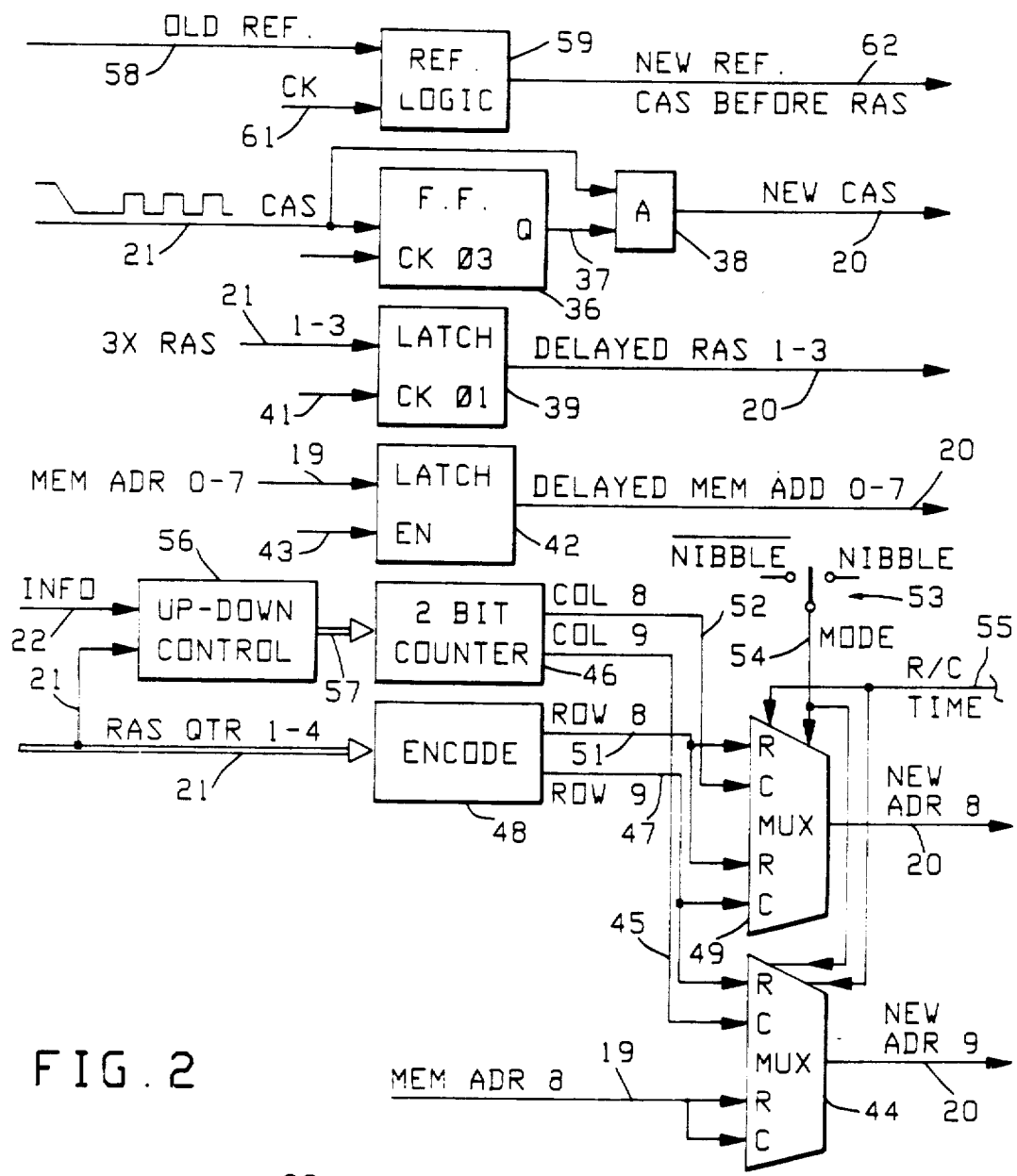
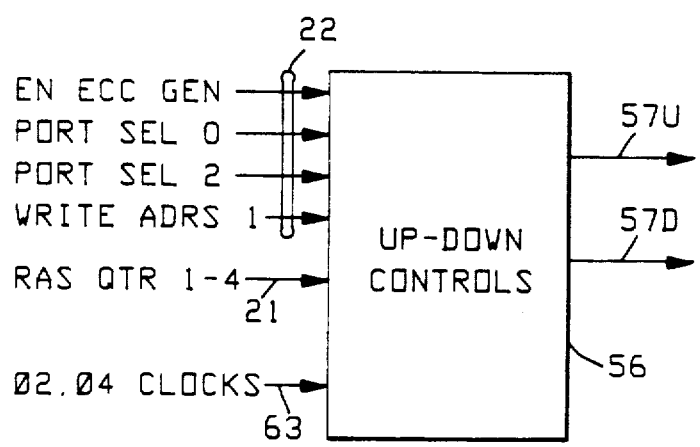
FIG. 2
FIG. 3

MULTI-MODE DRAM CONTROLLER

BACKGROUND OF THE INVENTION

1. Field of the Invention

The present invention relates to memory access control logic circuits. More particularly, the present invention relates to a novel multi-mode controller for accessing a plurality for different types of commercially available dynamic random access memory chips (DRAM) which form a main storage unit (MSU) of a computer.

2. Description of the Prior Art

Main storage units (MSUs) are typically used with main frame computers. More recently, powerful micro processor chips of the type made by Intel and Motorola have been incorporated into small powerful computing systems which incorporate therein large amounts of dynamic random access memory (DRAM) storage. The trend toward faster computing speeds and the use of reduced instruction set chips (RISC) in workstations of the type used for graphics, simulation and various computer-aided design (CAD), computer-aided engineering (CAE) and computer aided manufacturing (CAM), have imposed a need for faster active memory chips and larger sizes of the memory storage.

One way to increase the speed of DRAM memory chips is to reduce the size of the discreet devices on the chips and/or to place more memory cells on the same chip or real estate. Another way of accomplishing faster memory access is to employ a chip that is inherently faster by virtue of its design and logic families such as ECL technology versus TTL technology and also the type of memory such as page mode verses static column mode designs.

When designing a computer for use with memory boards or MSUs, it would be desirable to work with DRAM memory chips of the latest and fastest commercially available design that is also cost efficient, thus, the mainframe computer should be capable of accepting different size memory chips as well as different types of memory chips.

SUMMARY OF THE INVENTION

It is a principal object of the present invention to provide a DRAM controller capable of addressing various size and types of commercially available DRAM chips.

It is another principle object of the present invention to provide a multiple mode DRAM controller for accessing different size, type and speed DRAMs.

It is a principle object of the present invention to provide a multiple-mode controller for addressing single or multiple words in MSUs comprising different operational type DRAMS.

It is another object of the present invention to provide a single DRAM controller for use with three of more different type of DRAM chips.

It is another object of the present invention to provide a novel DRAM controller which may be set in a different operational mode at the factory or in the field.

It is the general object of the present invention to provide a novel DRAM controller which enables a computer to accept larger and faster DRAM chips as they become commercially available and economically feasible.

According to these and other objects of the present invention there is provided a novel multi-mode DRAM contoller adapted to access DRAM chips, of different size and at least three different operational types including Nibble mode, Page mode and Static mode types by converting command register information from one mode to information usable by a different mode DRAM, and for expanding the limited addresses for a small DRAM chip to a larger number addresses for a larger DRAM chip.

BRIEF DESCRIPTION OF THE DRAWINGS

FIG. 2 is a detailed block diagram of the address generation control logic for accessing the DRAM memory shown in FIG. 1;

FIG. 3 is a more detailed block diagram of the up/down controller employed in the control logic of FIG. 2.

DETAILED DESCRIPTION OF THE PEREFERRED EMBODIMENT

Figure 1:
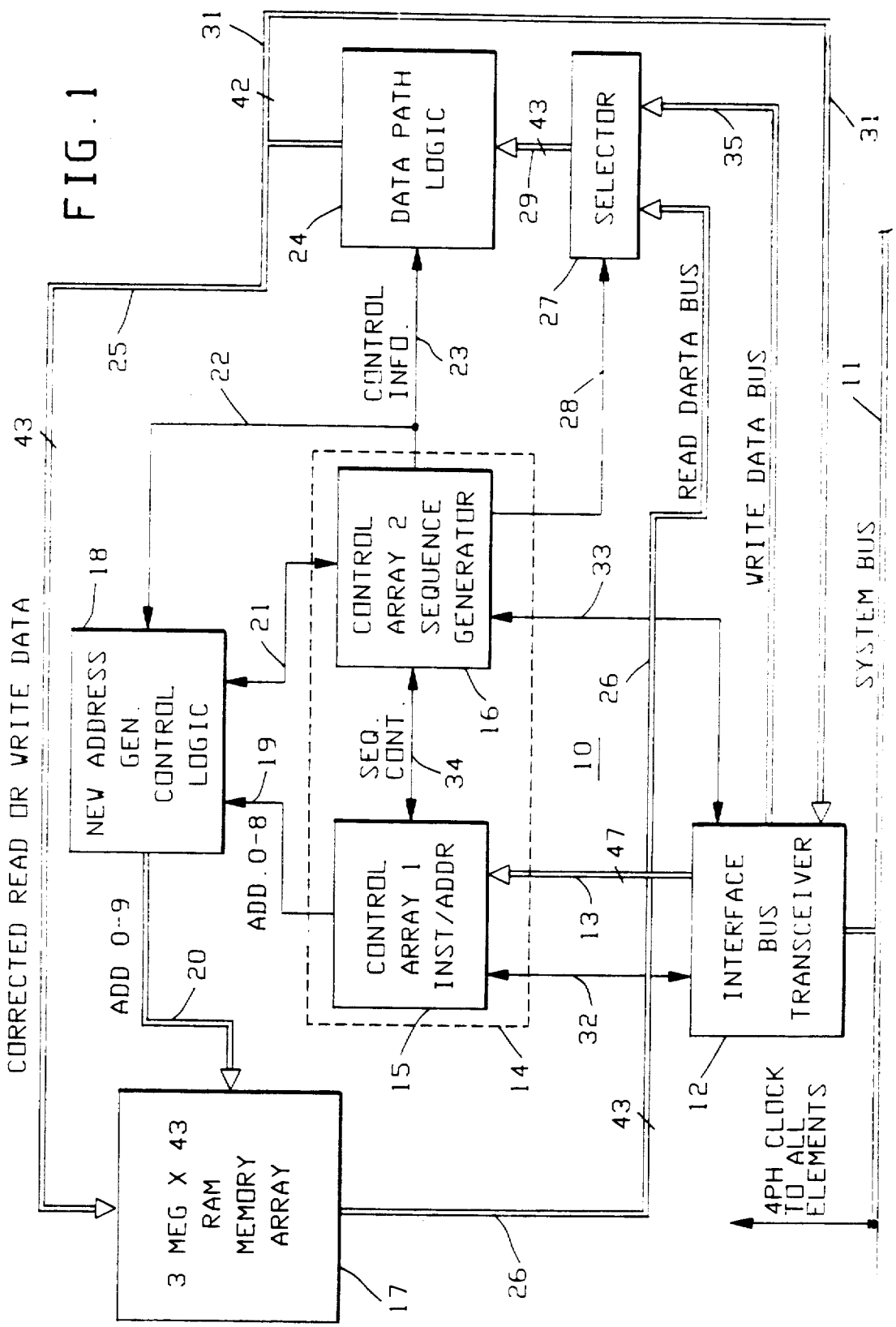
FIG. 1 is a block diagram showing the present invention multi-mode read data controller and associated MSU having a system bus architecture environment.

Refer now to FIG. 1 showing a block diagram of the present invention which is incorporated into a prior art system bus architure environment. FIG. 1 basically comprises one of up to four MSUs 10 which are employed in a mainframe computer environment. MSU 10 is shown comprising a three Meg by forty-three bit RAM memory which is the largest memory to be accessed with the specific invention to be described hereinafter. A normal RAM memory for the present invention computer is the same size but employs four times as many smaller RAM chips. The prior art RAM chip size was 256K bits and the most modern commercially feasible RAM chip is a one Meg RAM chip which requires nine address bits instead of eight address bits as formerly used for a 256K normal MSU memory.

The system bus architure of the present invention employs a system bus 11 which connects to the main CPU and the input output devices through controllers not shown. An instruction type address on system bus 11 from a CPU, etc. is presented to the interface bus transceiver 12. The transceiver 12 is connected via a 47 line bus 13 to a controller 14 which comprises an instruction/address controller portion 15 and a sequence generator controller portion 16.

In the prior art mainframe computer a controller like controller 14 would generate an address signal which could be coupled directly to the RAM memory array 17 comprising 256K chips. However, when the larger and more dense one Meg RAM memory chips are employed the address formerlly used to address the 256K memory chips must be modified to include a new address comprising an additional bit in order to automatically make this address expansion conversion. A novel new address generation control logic circuit 18 is provided between the controller 14 and the RAM memory array 17. As will be explained in greater detail hereinafter, the old address will be expanded and the row address signals (RAS) and column address signals (CAS) which contain the synchronizing information will be delayed and modified so as to synchronize the new address with the expanded memory 17. In this regard, the information on line 19 will be shown to contain address bit information and the information on line 21 will contain the RAS/CAS information. The information on line 22 will contain information for controlling the novel up/down control of the new address generation control logic 18. The output line 23 from the sequence generator 16 is shown coupled to the data path logic 24 having an output bus 25 which is connected as an input to the memory array 17. During a write operation, the information on bus 25 is written directly into the memory array 17 without modification. However, during a read operation the output from the memory array 17 on read bus 26 is passed through a selector 27 under control of control line 28 from the sequence generator 16. The output from the selector 27 on bus 29 is error corrected and parity checked in logic 24 and produces the corrected information on line 25 and on branch bus 31. The corrected information on branch bus 31 is always passed through the data path logic 24 and the interface transceiver 12 for presentation on system bus 11. The corrected information on bus 25 is written over the previous information in memory array 17, however if not corrected, it need not be written over the information in the memory array 17.

Bi-directional control lines 32 and 33 are shown connected between the interface bus tranceiver 12 and the controller 14. A control line 34 in shown connected between the two control arrays 15 and 16. When information is to be written into the memory array 17, it is presented on system bus 11 at transciever 12 and passed by write data bus 35, selector 27, bus 29 and data path logic 24 to bus 25. The write data presented to data path logic 24 is parity checked and the generated parity check bits on bus 25 are written into memory array 17 along with the data.

Refer now to FIG. 2 showing a more detailed block diagram of the address generation control logic 18 shown in FIG. 1. The column address signals (CAS) are shown applied to line 21 as an input to CAS flip-flop 36 to produce a Q output on line 37 which is applied to an AND gate 38 along with a CAS input signal to produce a delayed new CAS output signal on line 20. The new CAS output signal on line 20 is shown in FIG. 1 applied to the RAM memory array 17 as are the other output signals which will be explained hereinafter. Three different mutually exclusive row address signals (RAS) signals will be applied to line 21 to access one of three memory banks in the memory array 17. The RAS signals on line 21 and the phase one clock signal on line 41 are applied to the RAS delay latch 39 to produce the desired new or modified delayed RAS signals on output line 20.

The memory address signals on line 19 (also shown in FIG. 1) are applied to the memory address latch 42 along with an enable signal on line 43 to produce the desired delayed memory address bits 0 through 7 on output line 20. In similar manner, the eighth memory address bit on line 19 is shown being applied to the row and column inputs of a 4 to 1 Mux 44 along with two additional inputs, to be explained hereinafter. Mux 44 produces the 9th adddress bit (New ADR 9) on line 20 as shown. The input to Mux 44 on line 45 from two bit counter 46 is the column 9 address bit as will be explained in greater detail hereinafter. The input on line 47 to Mux 44 is the row 9 input from encoder 48. Line 47 also generates the column 8 input to Mux 49. Encoder 48 also produces the row 8 output signal on line 51 which is applied to two of the row/column inputs of Mux 49. A fourth input to Mux 49 is provided by 2 bit counter 46 as a column 8 input on line 52.

Mode selection switch 53 is shown having two possible selections. The not nibble (NOT $\overline{N}$) and nibble terminals of switch 53 are applied as mode selection inputs to Mux 49 and Mux 44 via line 54. A further row/column time selection input to Mux 49 and Mux 44 is shown at input line 55. Mux 49 and Mux 44 produce the new address bit 8 and new address bit 9 respectively as will now be explained. The information on input line 22 to up/down control 56 along with a RAS quarter input signal on line 21 is shown producing an output on line 57. The output signal on line 57 determines the direction of the count in 2 bit counter 46 and usually counts up from 00 to 11 before resetting but is capable of counting down depending on the type of operation presented on information line 22.

It will be understood that the RAS quarter information on line 21 was previously supplied by the controller 14 directly to the RAM memory array 17 to select one of the four 256K chips within a one Meg bank that is now employed to provide information which may be encoded into address information for one Meg chips. The information on line 21 which is applied to encoder 48 produces the encoded row 8 information on line 51 and the row 9 column 8 information on line 47 which is applied to the Mux 49 and the Mux 44 as shown. With the information outputted from 2 bit counter 46 and encoder 48, a new address bit 8 and a new address bit 9 is produces on output line 20 as shown from Mux 49 and Mux 44 respectively. It will now be understood that all of the information shown in FIG. 2 output lines 20 is shown as input information on FIG. 1 to the 3 Meg RAM array 17 shown in FIG. 1.

The old refresh signal line 58 is shown applied as an input to new refresh logic 59 along with a clock signal on line 61. Ordinarily the signal on line 58 would be used to initiate a refresh signal in a one Meg bank of four 256K chips. The refresh requirements for a 3 Meg bank of 1 Meg chips requires that the refresh signal on line 58 be modified to produce the equivalent of two refresh signals for each refresh signal in the smaller memory array. The new logic refresh signal on line 62 comprises a CAS before RAS sequence of signals which informs the larger memory chips to perform a refresh operation. It will be understood that the refresh operation for the larger RAM memory array is designed to accept such logic signals and the timing is provided by the controller 14 which produces the clock signal on line 61.

Refer now to FIG. 3 showing a more detailed block diagram of the up/down control 56 employed in the control logic 18. The output line 57 from the up/down control 56 shown in FIG. 2 is shown in FIG. 3 as providing an up count on line 57U and a down count on line 57D and having the following inputs. Phase 2 and phase 4 clock inputs are shown on line 63 as an inputs to up/down control 56 along with the RAS quarter (1-4) input signal on line 21. The bypass line 22, shown as an output from sequence generator 16 in FIG. 1, is shown as four input lines to the up/down control 56 for enabling the up/down control 56 to make a logic determination as to the type of instruction that is being performed. The inputs labled enable error code generation, port selection 0 and 2, and write address 1 are employed to make this determination.

Figure 4:
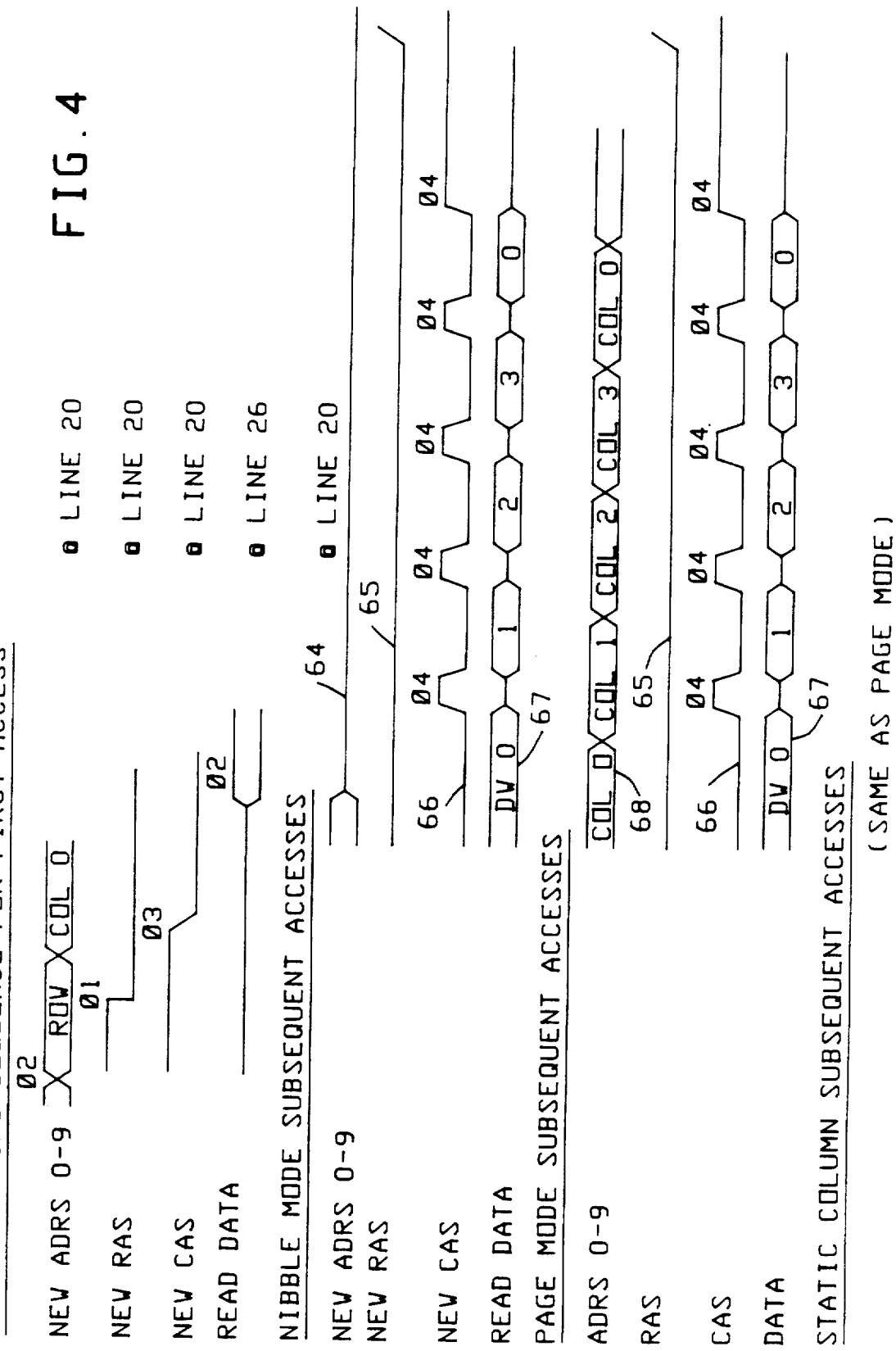
FIG. 4 is a schematic wave form diagram showing the common control wave forms used to access any dynamic type of RAM memory and the specific subsequent control wave forms which are employed to access three different types of DRAM memory.

Refer now to FIG. 4 showing four sets of schematic wave form diagrams. The first set of four wave form diagrams are labled common timing sequence for first access and comprise a new address 0 to 9 signal which appears on line 20 in FIG. 1 and also appears on lines 20 as the outputs of latch 42, Mux 49 and Mux 44 of FIG. 2.

The new RAS signal is shown generated on a line in bus 20 (also shown in FIG. 1 and in FIG. 2 as the output of latch 39). This signal is clocked or timed by a phase 1 input signal. The new CAS signal is timed by flip flop 36 on the trailing edge of a phase 3 signal to produce a low active signal on line 20. In similar manner the read data signal may be available on line 25 (or subsequently on line 26) but must occur before the mid point of the phase 2 cycle on line 26 as shown.

The second set of wave forms shown in FIG. 4 are for the nibble mode subsequent accesses occuring at the input to the RAM array 17. Two cycles after the occurance of the row and column address in the first sequence, the new address 0 to 9 reaches a "don't care" state at line 20 shown as line 64. The new RAS signal at line 65 stays low active for the duration of the read or write operation. The new CAS signal 66 is shown going from its low active state to high inactive during the beginning of phase 4 and only lasting for the duration of a phase 4 cycle before going low active. The read data on line 67 remains valid during the same time period that new CAS is low active on line 66. In order to achive the nibble mode the switch 53 in FIG. 2 must be toggled to the nibble terminal so that mode line 54 is in the nibble mode.

The third sequence of wave forms are shown as the page mode subsequent accesses wherein the address 0 to 9 is shown as wave form 68. The column envelop signal 68 is indicative of the column address and maintains an enabled state over a period of four phases or one cycle. The RAS signal 65 is shown as previously still maintaining its low active state during the duration of the sequence. As previously described, the CAS signal is low active and goes high inactive during phase 4 and drops back to an active state at the end of phase 4 and is shown being approximately centered during the time sequence of the enabling envelope of the columns at wave form 68. The read data signal on line 67 is enabled during the CAS low active signal time 66 and is disabled during the CAS high or inactive signal time.

The page mode sequence and the fourth set of static column subsequent access waveforms are activated by having the mode switch 53 in the not nibble mode ($\overline{\text{N}}$). The four wave forms 68, 65, 66 and 67 for the static column sequence are identical to the page mode sequence and are numbered the same.

It will be understood that the wave forms shown in FIG. 4 are those generated on bus 20 and are applied to the RAM memory 17 to perform the read or write operations described hereinbefore. The switch 53 which selects the mode may be a physical switch or a hard wired switch incorporated in the address generation control logic 18 and must be properly set to conform to the type of DRAM to be used in the MSU.

Having explained a perferred embodiment of the present invention it will be understood that the MSU 10 shown in FIG. 1 is a modified MSU which includes new address generating control logic 18 which enables different types and sizes of RAM memory array 17 to be incorporated into the same or different computers. Stated differently, the previous control logic can be employed with the new address generation control logic 18 without modification when using a small prior art 256K memory chip array. The control logic 18 is also employed when using the modern, more dense and faster 1 Mega bit memory array chips. Further, the same invention concept may be employed for expanding memories for other types of computers by using the new address generation control logic for addressing more dense and larger memory arrays using the same initial control signals employed for prior art memories.

What is claimed is:

1. A multi-mode DRAM controller for accessing different size and operational mode types of RAM memory chips comprising:
    a RAM memory to be accessed having a greater number of memory addresses than is provided in a normal memory controller;
    access control means for generating normal column and row address signals and for generating normal instructions and normal sequences of operation to access addresses in a normal size RAM memory;
    new address logic means coupled between said RAM memory and said access control means;
    said new address logic means comprising latch means for generating delayed normal column and row address signals,
    said new address logic means further comprising column and row encoding means for generating additional column and row address signals indicative of a greater number of memory addresses than contained in a normal size RAM memory,
    said new address logic means further comprising means for synchronizing said additional column and row address signals with said delayed normal column and row address signals to provide new column and row address signals together having a greater capacity to define said greater number of memory addresses in said RAM memory,
    said means for synchronizing said additional column and row address signals comprises multiplexor means coupled to said column and row encoding means for generating said new column and row address signals; and
    mode switch selection means in said new address logic means for selecting different operational mode types of larger RAM memory chips to be addressed.

2. A multi-mode DRAM controller as set forth in claim 1 wherein said access control means comprises means for generating a normal column address signal CAS and normal address information for addressing a normal size memory, and said new address logic means further includes flip flop means coupled to said CAS address signal to provide delayed CAS output signals for addressing larger size memory chips.

3. A multi-mode DRAM controller as set forth in claim 1 wherein said access control means comprises means for generating a normal row address signal RAS and normal address information for addressing a normal size memory, and said new address logic means further includes latch means coupled to said RAS output signal for providing delayed RAS output signals for addressing larger size memory chips.

4. A multi-mode DRAM controller as said forth in claim 1 wherein said access control means comprises means for generating a column and row memory address for the most significant address bits of said larger RAM memory chips, and said new address logic means further includes latch means coupled to said most significant address bits for providing said delayed normal column and row memory address signals.

5. A multi-mode DRAM controller as set forth in claim 1 wherein said access control means comprises means for generating a least significant address bit signal, and said multiplexor means further includes a pair of multiplexors coupled to said access control means for providing a pair of new address least significant bits as output address signals.

6. A multi-mode DRAM controller as set forth in claim 5 wherein said new address logic means further includes an up/down control having inputs coupled to said access control means and an output coupled to a two bit counter, said counter having an output coupled to said pair of multiplexors to provide two new least significant address bits as an output.

7. A multi-mode DRAM controller as set forth in claim 6 wherein said new address logic means further includes an encoder coupled to the input of said pair of multiplexors for providing said two new least significant bits as an output.

* * * * *